(12) United States Patent
Wang et al.

(10) Patent No.: US 7,994,821 B1
(45) Date of Patent: Aug. 9, 2011

(54) LEVEL SHIFTER CIRCUITS AND METHODS

(75) Inventors: Xiaobao Wang, Cupertino, CA (US);
Chiakang Sung, Milpitas, CA (US);
Khai Nguyen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/753,389

(22) Filed: Apr. 2, 2010

(51) Int. Cl.
*H03K 19/0175* (2006.01)

(52) U.S. Cl. ............... 326/81; 326/68; 326/83

(58) Field of Classification Search ............ 326/62–63, 326/68, 80–83, 86–87; 327/333
See application file for complete search history.

(56) References Cited

U.S. PATENT DOCUMENTS

| | | | |
|---|---|---|---|
| 4,039,862 A * | 8/1977 | Dingwall et al. | 327/333 |
| 5,781,026 A | 7/1998 | Chow | |
| 6,002,290 A | 12/1999 | Avery et al. | |
| 7,388,403 B1 * | 6/2008 | Yang | 326/68 |
| 2006/0208759 A1 | 9/2006 | Nojiri | |
| 2008/0074148 A1 | 3/2008 | Srivastava et al. | |
| 2010/0061164 A1 * | 3/2010 | Tandon et al. | 365/189.11 |

* cited by examiner

*Primary Examiner* — Rexford N Barnie
*Assistant Examiner* — Jany Tran
(74) *Attorney, Agent, or Firm* — Steven J. Cahill

(57) ABSTRACT

A level shifter circuit includes first and second transistors coupled in series and third and fourth transistors coupled in series. The fourth transistor is coupled to a first node between the first and the second transistors. The level shifter circuit also includes fifth and sixth transistors coupled in series and seventh and eighth transistors coupled in series. The eighth transistor is coupled to a second node between the fifth and the sixth transistors. The second and the eighth transistors receive a first input signal at control inputs. The fourth and the sixth transistors receive a second input signal at control inputs. The second input signal is inverted relative to the first input signal.

20 Claims, 5 Drawing Sheets

LEVEL SHIFTER CIRCUITS AND METHODS

BACKGROUND

The present invention relates to electronic circuits, and more particularly, to level shifter circuits and methods.

Input/output (IO) buffers in many field programmable gate array (FPGA) devices receive charge from a 2.5 volt supply voltage. The IO buffers in these FPGA devices have 2.5 volt transistors that are used to support legacy IO standards such as low voltage transistor—transistor logic (LVTTL) and Peripheral Component Interconnect (PCI). Transistors in the core area of an FPGA device receive charge from a low supply voltage. When an input signal from the core of the FPGA that varies between ground (at 0 volts) and the low supply voltage reaches the IO buffer, the input signal is level shifted to an output signal that varies between a supply voltage of 2.5 volts and ground.

FIG. 1 illustrates a conventional level shifter circuit 100. Level shifter circuit 100 can generate an output signal OUT having a frequency up to 333 Megahertz (MHz). Level shifter 100 includes p-channel metal oxide semiconductor (MOS) field-effect transistors 101-102, n-channel MOS field-effect transistors 103-104, and inverters 105-106. An input signal IN is transmitted to an input of level shifter circuit 100 from the core circuitry of an FPGA integrated circuit. The core circuitry of the FPGA is powered by a low supply voltage VCC. Inverters 105-106 also receive supply voltage VCC. The sources of transistors 101-102 are coupled to a supply voltage node at a high supply voltage VCCIO.

When input signal IN is in a logic low state, transistor 103 is off, transistor 104 is on, transistor 101 is on, and transistor 102 is off, and level shifter 100 drives output signal OUT to a logic low state (i.e., at the ground voltage). When input signal IN is at VCC (i.e., in a logic high state), transistor 103 is on, transistor 104 is off, transistor 101 is off, and transistor 102 is on, and level shifter 100 drives output signal OUT to supply voltage VCCIO. Transistors 101-104 are thick oxide devices that have threshold voltages of about 0.6 volts.

If VCC equals 0.85 volts, and VCCIO equals 2.5 volts, the gate-source voltage overdrive for PMOS transistors 101-102 is 2.5 volts−0.6 volts=1.9 volts, and the gate-source voltage overdrive for NMOS transistors 103-104 is 0.85 volts−0.6 volts=0.25 volts. Because the gate-source voltage overdrive for PMOS transistors 101-102 is much larger than the gate-source voltage overdrive for NMOS transistors 103-104, NMOS transistors 103-104 are designed to have much larger width-to-length channel ratios than PMOS transistors 101-102. Because transistors 103-104 have a low gate-source voltage overdrive, the speed of level shifter 100 is sensitive to variations in the supply voltage VCC and the threshold voltages of transistors 101-104.

Another disadvantage of level shifter 100 is that capacitive coupling between the input node at INB and the output node at OUT slows down the transition of the output signal OUT. For example, in order for output signal OUT to transition from 0 volts to VCCIO, a low-to-high transition in input signal IN needs to propagate through inverters 105-106 and transistor 103 to turn on transistor 102. The low-to-high transition in input signal IN also propagates through inverter 105 to turn off transistor 104. Because the delay path through inverter 105 and transistor 104 is shorter, a high-to-low transition in signal INB couples negative charge to output signal OUT, causing OUT to dip before transistor 102 pulls OUT to VCCIO, which slows down the rising edge in output signal OUT.

FIG. 2 illustrates a prior art level shifter circuit 200 that can generate an output signal OUT having a frequency of up to 600 MHz. Level shifter circuit 200 includes PMOS field-effect transistors 201-204, NMOS field-effect transistors 205-208, and inverters 209-210. NMOS transistors 205-206 are native NMOS transistors that have threshold voltages of about zero volts. Transistors 207-208 are thin oxide transistors that have threshold voltages of about 0.25 volts. Transistors 201-206 are thick oxide transistors. The transistors in inverters 209-210 are thin oxide transistors.

If VCC is 0.85 volts, and VCCIO is 2.5 volts, the pull down gate-source overdrive voltage of transistors 207-208 is increased compared to level shifter 100 to 0.85 volts−0.25 volts=0.6 volts. Although transistors 205-206 have threshold voltages near zero volts, transistor 207 is off when transistor 208 is on preventing leakage current through transistor 207, and transistor 208 is off when transistor 207 is on preventing leakage current through transistor 208. Native NMOS transistors 205-206 isolate thin oxide transistors 207-208 so that transistors 207-208 are not exposed to an over stress of 2.5 volts from VCCIO.

One disadvantage of level shifter circuit 200 is that by coupling transistors 202 and 204 in series, the pull up current to the output signal OUT is reduced, which reduces the maximum frequency of OUT. Another disadvantage of level shifter circuit 200 is that the addition of transistor 204 increases capacitive coupling between the node at INB on the gates of transistors 204 and 206 and the output node at OUT.

BRIEF SUMMARY

According to some embodiments, a level shifter circuit includes first and second transistors coupled in series. The level shifter circuit also includes third and fourth transistors coupled in series. The fourth transistor is coupled to a first node between the first and the second transistors. The level shifter circuit also includes fifth and sixth transistors coupled in series. The level shifter circuit also includes seventh and eighth transistors coupled in series. The eighth transistor is coupled to a second node between the fifth and the sixth transistors. The second and the eighth transistors receive a first input signal at control inputs. The fourth and the sixth transistors receive a second input signal at control inputs. The second input signal is inverted relative to the first input signal.

Various objects, features, and advantages of the present invention will become apparent upon consideration of the following detailed description and the accompanying drawings.

DETAILED DESCRIPTION

Memory interfaces such as DDR3 have steadily increased performance in the last few years from 333 MHz to 1 GHz. Therefore, it would be desirable to provide a level shifter circuit that can generate an output signal having a frequency of 1 Gigahertz (GHz) as required by some memory interface standards.

Figure 1:
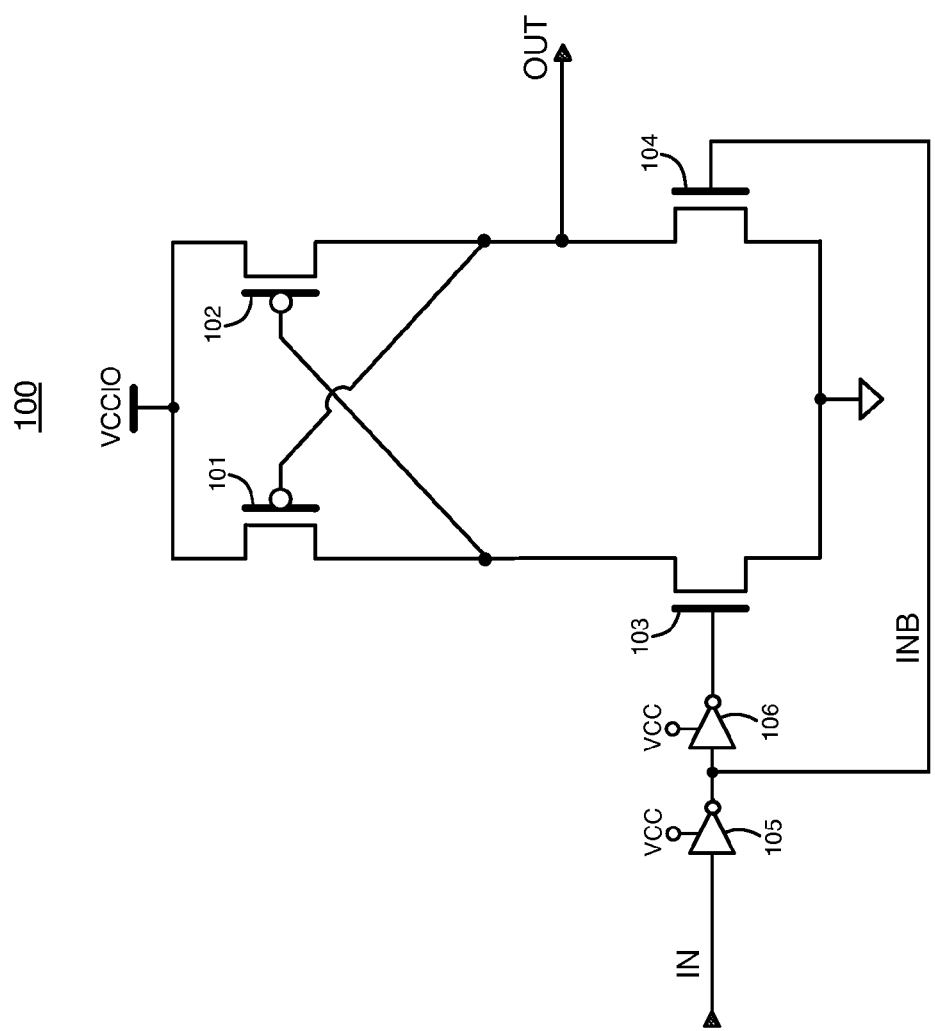
FIG. 1 illustrates a prior art level shifter circuit.
Figure 2:
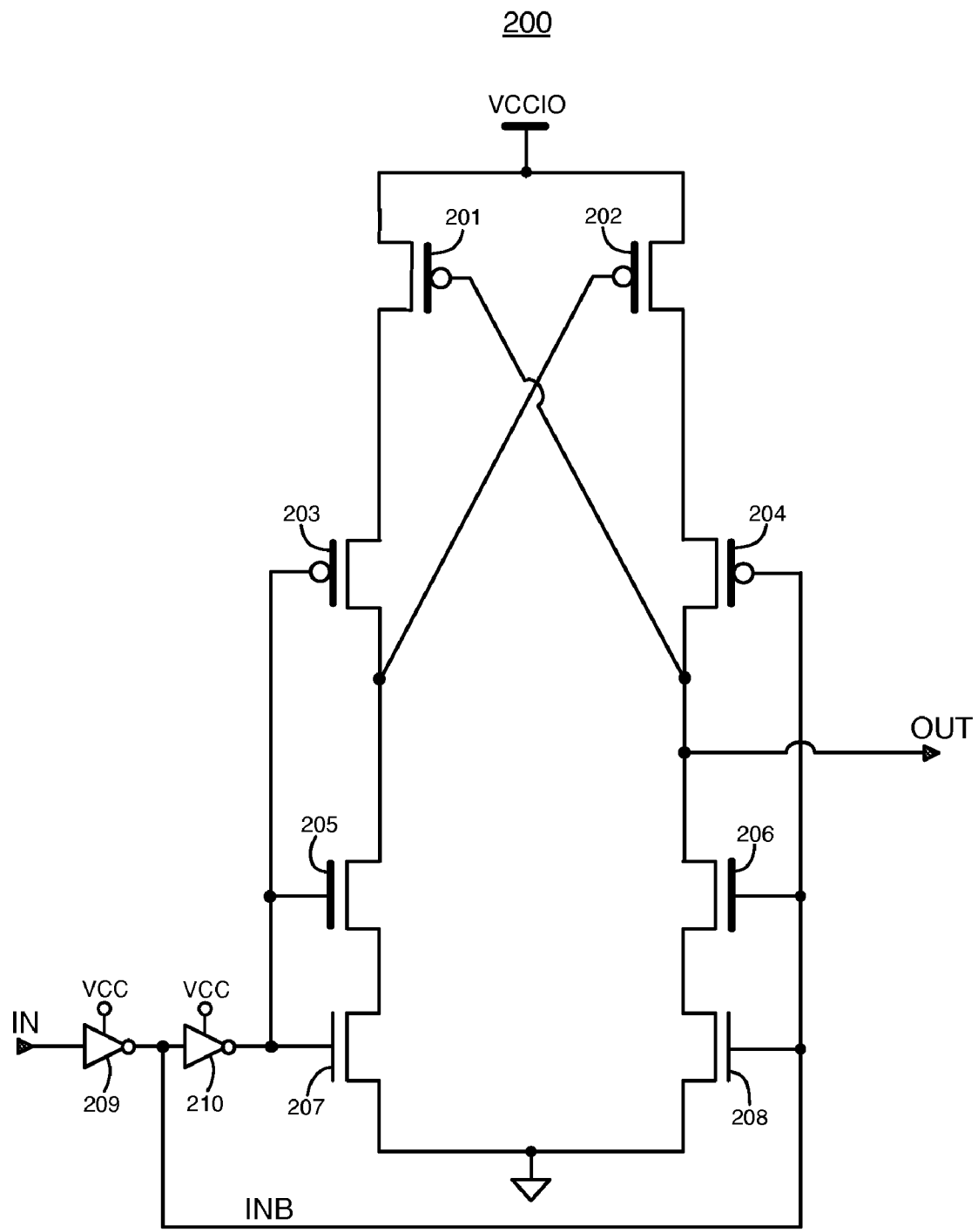
FIG. 2 illustrates another prior art level shifter circuit.
Figure 3:
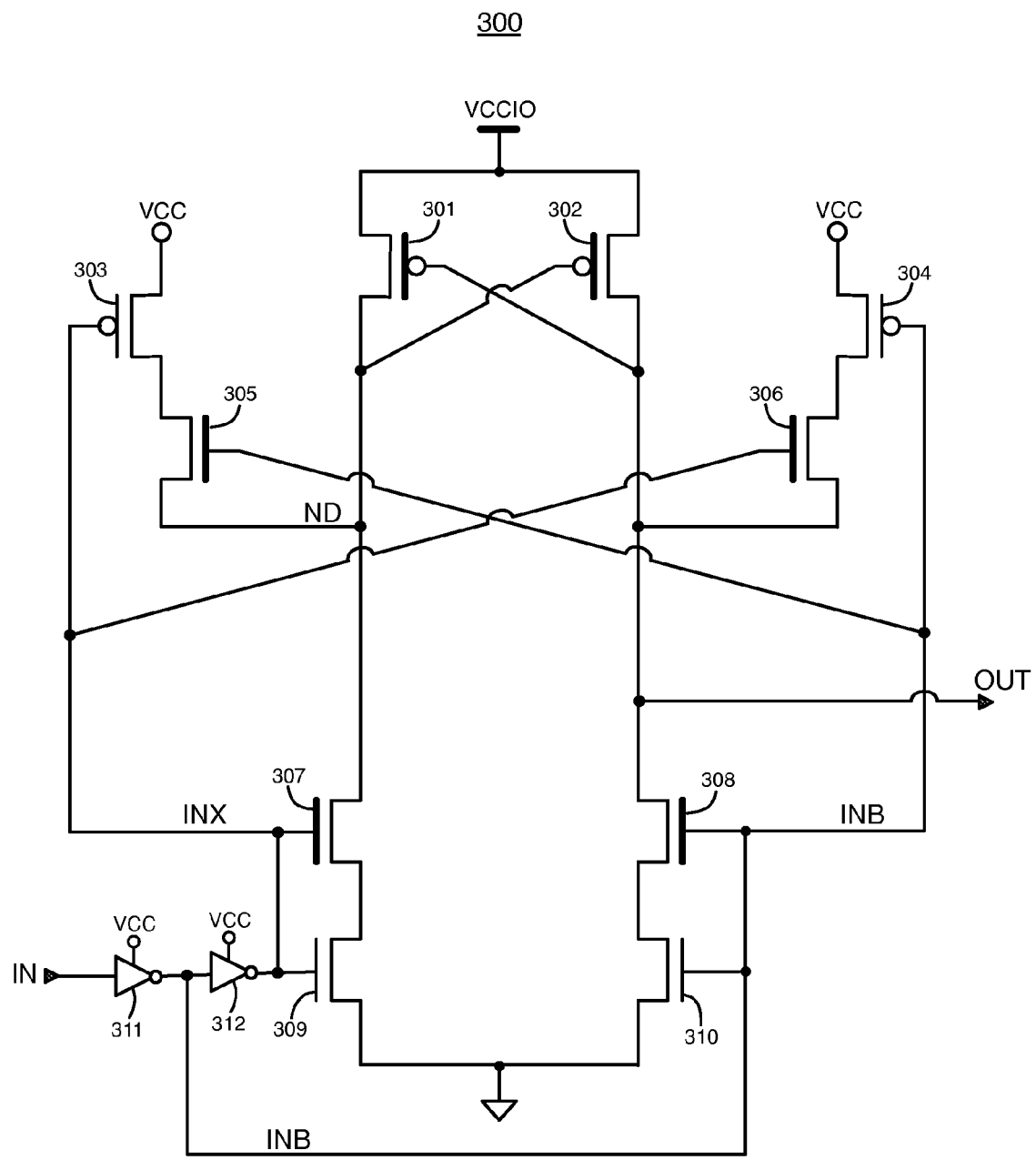
FIG. 3 illustrates an example of a level shifter circuit, according to an embodiment of the present invention.

FIG. 3 illustrates an example of a level shifter circuit 300 according to an embodiment of the present invention. Level shifter 300 includes p-channel metal oxide semiconductor (PMOS) field-effect transistors 301-304, n-channel metal oxide semiconductor (NMOS) field-effect transistors 305-310, and CMOS inverter circuits 311-312. Level shifter circuit 300 can be fabricated on an integrated circuit such as a field programmable gate array or other type of integrated circuit.

Level shifter circuit 300 receives an input signal IN that varies between a low supply voltage VCC and a ground voltage (e.g., 0 volts). Inverters 311-312 receive charge from VCC. The sources of PMOS transistors 301-302 are coupled to a node at a high supply voltage VCCIO. PMOS transistors 301 and 302 are cross-coupled. The sources of PMOS transistors 303-304 are coupled to a node at VCC. VCCIO can be, for example, 2.5 volts. VCC can be, for example, 0.85 volts. The sources of transistors 309-310 are coupled to a node that is at the ground voltage.

Transistor 305 is coupled to node ND between transistors 301 and 307. Transistor 306 is coupled to the output node at OUT between transistors 302 and 308. Transistors 303 and 305 are coupled together in series. Transistors 304 and 306 are coupled together in series. Transistors 301, 307, and 309 are coupled in series. Transistors 302, 308, and 310 are coupled in series.

Inverter 311 inverts input signal IN to generate inverted signal INB. Inverted input signal INB is transmitted to the gates of transistors 304, 305, 308, and 310. Inverter 312 inverts INB to generate signal INX. Signal INX is a delayed version of input signal IN. Signal INX is transmitted to the gates of transistors 303, 306, 307, and 309. The right half of level shifter 300 is symmetrical with the left half of level shifter 300, excluding inverters 311-312.

Transistors 305-306 and 307-308 are native NMOS transistors that have threshold voltages of about zero volts. PMOS transistors 303-304 and NMOS transistors 309-310 have threshold voltages of about 0.25 volts. PMOS transistors 301-302 have threshold voltages of about 0.6 volts.

Transistors 301-302, 305-306, and 307-308 are thick oxide transistors. As an example, transistors 301-302, 305-306, and 307-308 may have gate oxide thicknesses of about 45-65 angstroms. 55 angstroms is a specific example of a gate oxide thickness of each of the thick oxide transistors. Transistors 303-304 and 309-310 are thin oxide transistors. As an example, transistors 303-304 and 309-310 may have gate oxide thicknesses of about 10-25 angstroms. 17 angstroms is a specific example of a gate oxide thickness of each of the thin oxide transistors. The transistors in inverters 311-312 are also thin oxide transistors.

Transistors 301 and 302 have smaller width-to-length (W/L) channel ratios compared to transistors 101 and 102 in level shifter 100, respectively. As an example, transistors 301 and 302 may have W/L channel ratios that are 70% of the W/L channel ratios of transistors 101-102, respectively. The W/L channel ratios of PMOS transistors 301-302 are also reduced relative to the W/L channel ratios of NMOS transistors 307-310. Because transistors 301 and 302 have smaller W/L channel ratios, the gate-source overdrive voltage applied to transistors 301-302 generates a reduced current through each of transistors 301-302.

Transistors 303 and 304 may have W/L channel ratios that are smaller, the same, or larger than the W/L channel ratios of transistors 301 and 302, respectively. As an example, transistors 301 and 303 together may generate approximately the same current as transistor 101, and transistors 302 and 304 together may generate approximately the same current as transistor 102, when these transistors are on.

An example of the switching of output signal OUT between VCCIO and the ground voltage is now described assuming that OUT and IN are initially at the ground voltage. After input signal IN transitions from the ground voltage to VCC, inverter 311 pulls signal INB from VCC to the ground voltage, turning transistors 305, 308, and 310 off and turning transistor 304 on. After INB transitions to ground, inverter 312 pulls signal INX from the ground voltage to VCC, turning transistors 306, 307, and 309 on and turning transistor 303 off. Because transistor 303 is off, transistors 307 and 309 only need to sink the reduced current through PMOS transistor 301 to decrease the gate voltage of PMOS transistor 302 in order to increase the current through transistor 302. Transistors 304 and 306 pull the voltage of output signal OUT to supply voltage VCC causing the current through transistor 301 to decrease. As the current through transistor 301 decreases, the current through transistor 302 increases. After the voltage of output signal OUT rises above VCC, transistor 306 turns off. Transistor 302 pulls the voltage of output signal OUT to supply voltage VCCIO, turning transistor 301 off.

The added current provided by transistors 304 and 306 and the reduced current through transistor 301 increases the speed of the transition of the output signal OUT from the ground voltage to VCCIO. When transistors 304 and 306 are on, transistors 304 and 306 and transistor 302 may, for example, provide the same or about the same pull up current as transistors 202 and 204 in level shifter 200.

After input signal IN transitions from VCC to the ground voltage (e.g., 0 volts), inverter 311 pulls signal INB from the ground voltage to supply voltage VCC, turning transistors 305, 308 and 310 on and turning transistor 304 off. After input signal INB transitions to VCC, inverter 312 pulls signal INX from VCC to the ground voltage, turning transistors 306, 307 and 309 off and turning transistor 303 on. Because transistor 304 is off, transistors 308 and 310 only need to sink the reduced current through PMOS transistor 302 to decrease the gate voltage of PMOS transistor 301 in order to increase the current through transistor 301. Transistors 303 and 305 pull the voltage at node ND to supply voltage VCC causing the current through transistor 302 to decrease. As the current through transistor 302 decreases, the current through transistor 301 increases. After the voltage at node ND rises above VCC, transistor 305 turns off. Transistor 301 pulls the gate voltage of transistor 302 at node ND to supply voltage VCCIO, turning transistor 302 off. After transistor 302 turns off, transistors 308 and 310 pull the voltage of output signal OUT to the ground voltage.

The added current provided by transistors 303 and 305 and the reduced current through transistor 302 increases the speed of the transition of the output signal OUT from VCCIO to the ground voltage. When transistors 303 and 305 are on, transistors 303 and 305 and transistor 301 may, for example, provide the same or about the same pull up current as transistors 201 and 203 in level shifter 200.

Level shifter circuit 300 has reduced capacitive coupling between the input signal and the output signal OUT. Transistors 306 and 308 are both native NMOS transistors that have about the same sizes (e.g., about the same W/L channel ratios). The gate voltages INX and INB of transistors 306 and 308, respectively, transition in opposite directions. Because the delay of inverter 312 is small, a rising edge occurs in INX at about the same time as a falling edge in INB, and a falling edge occurs in INX at about the same time as a rising edge in INB. As a result, the capacitive coupling between signal INX and output signal OUT cancels out the capacitive coupling between signal INB and output signal OUT. The net capacitive coupling from signals INX and INB to OUT is zero or near zero.

Thick oxide transistors 305 and 306 isolate thin oxide transistors 303 and 304, respectively, so that transistors 303 and 304 are not exposed to the high supply voltage VCCIO. Thick oxide transistors 307 and 308 isolate thin oxide transistors 309 and 310, respectively, so that transistors 309 and 310 are not exposed to the high supply voltage VCCIO. Because the thin oxide transistors are not exposed to the high supply voltage VCCIO, level shifter circuit 300 has a high degree of reliability.

Although transistors 307-308 have threshold voltages near zero volts, transistor 309 is off when transistor 310 is on preventing leakage current through transistor 309, and transistor 310 is off when transistor 309 is on preventing leakage current through transistor 310. Therefore, level shifter circuit 300 has no DC leakage currents.

If VCC is 0.85 volts, and VCCIO is 2.5 volts, the pull down gate-source overdrive voltage of transistors 309-310 is increased compared to level shifter 100 to 0.85 volts–0.25 volts=0.6 volts when these respective transistors are on. The increased pull down gate-source overdrive provided to transistors 309-310 increases the maximum frequency of OUT. The pull-up gate-source overdrive voltage provided to PMOS transistors 301 and 302 equals 2.5 volts–0.6 volts=1.9 volts when these respective transistors are on. But because the width-to-length (W/L) channel ratios of transistors 301-302 are reduced relative to the W/L channel ratios of transistors 307-310, the output signal voltage OUT transitions to the ground voltage faster, which increases the maximum frequency of OUT.

Level shifter circuit 300 is a high-speed level shifter circuit that can generate an output signal OUT having a high frequency. Level shifter circuit 300 can generate an output signal OUT that has a larger frequency than the output signals generated by either of level shifter circuits 100 or 200. For example, level shifter circuit 300 can generate an output signal OUT having a frequency of 1 GHz.

Figure 4:
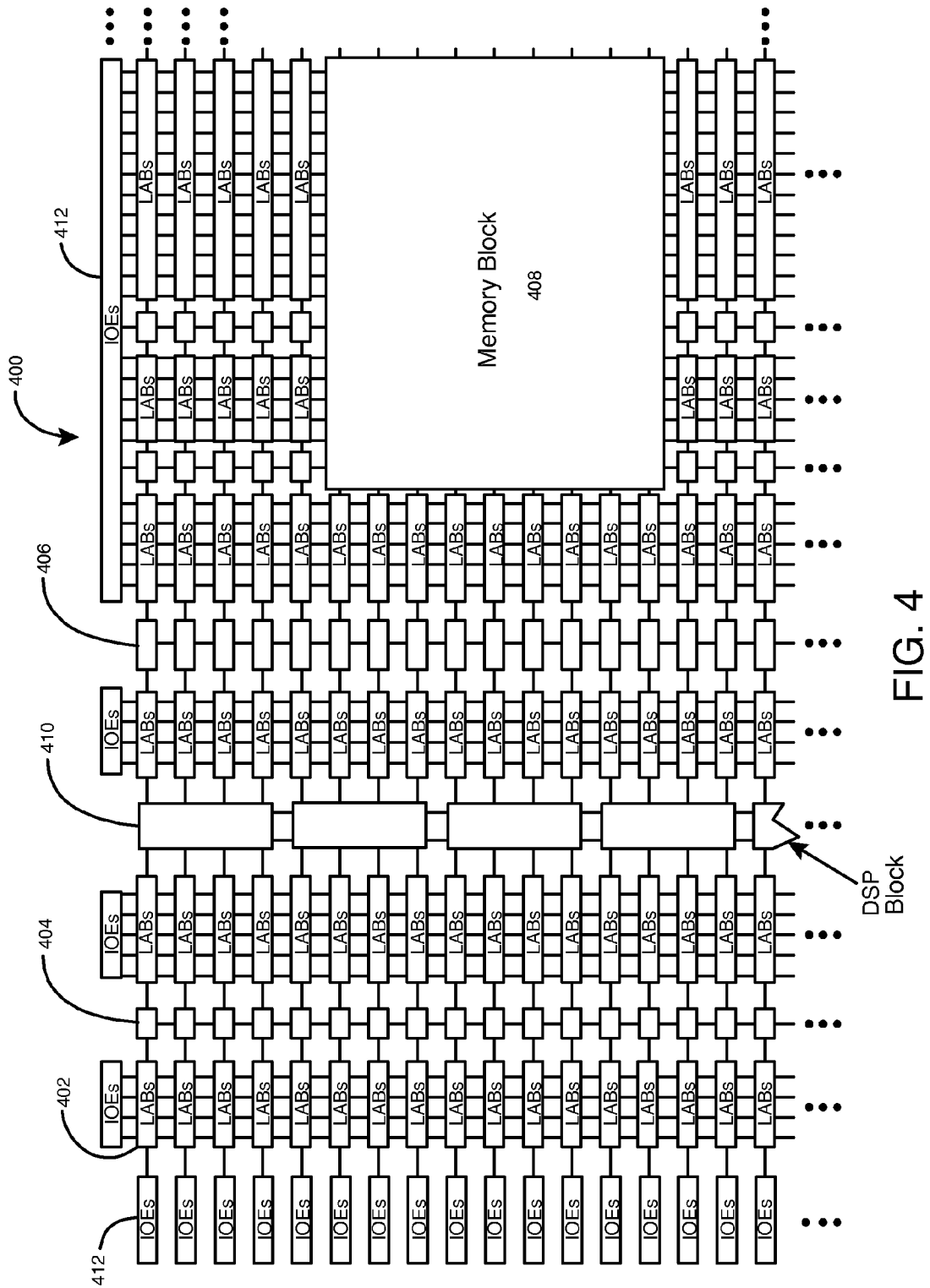
FIG. 4 is a simplified partial block diagram of a field programmable gate array (FPGA) that can include aspects of the present invention.

FIG. 4 is a simplified partial block diagram of a field programmable gate array (FPGA) 400 that can include aspects of the present invention. FPGA 400 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 400 includes a two-dimensional array of programmable logic array blocks (or LABs) 402 that are interconnected by a network of column and row interconnect conductors of varying length and speed. LABs 402 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 400 also includes a distributed memory structure including random access memory (RAM) blocks of varying sizes provided throughout the array. The RAM blocks include, for example, blocks 404, blocks 406, and block 408. These memory blocks can also include shift registers and first-in-first-out (FIFO) buffers.

FPGA 400 further includes digital signal processing (DSP) blocks 410 that can implement, for example, multipliers with add or subtract features. Input/output elements (IOEs) 412 located, in this example, around the periphery of the chip, support numerous single-ended and differential input/output standards. IOEs 412 include input and output buffers that are coupled to pads of the integrated circuit. The pads are external terminals of the FPGA die that can be used to route, for example, input signals, output signals, and supply voltages between the FPGA and one or more external devices. It should be understood that FPGA 400 is described herein for illustrative purposes only and that the present invention can be implemented in many different types of integrated circuits.

Figure 5:
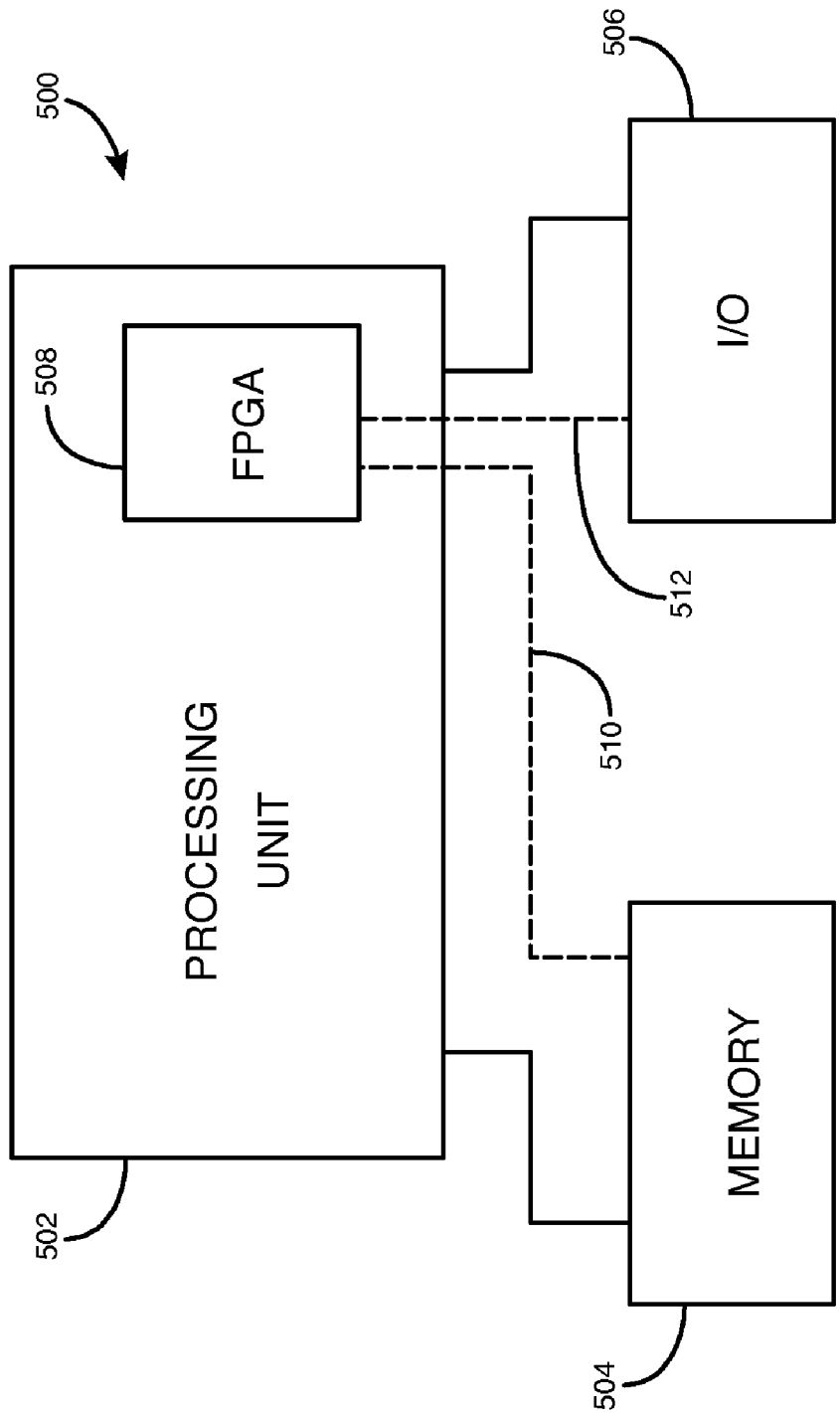
FIG. 5 shows a block diagram of an exemplary digital system that can embody techniques of the present invention.

The present invention can also be implemented in a system that has an FPGA as one of several components. FIG. 5 shows a block diagram of an exemplary digital system 500 that can embody techniques of the present invention. System 500 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 500 can be provided on a single board, on multiple boards, or within multiple enclosures.

System 500 includes a processing unit 502, a memory unit 504, and an input/output (I/O) unit 506 interconnected together by one or more buses. According to this exemplary embodiment, an FPGA 508 is embedded in processing unit 502. FPGA 508 can serve many different purposes within the system of FIG. 5. FPGA 508 can, for example, be a logical building block of processing unit 502, supporting its internal and external operations. FPGA 508 is programmed to implement the logical functions necessary to carry on its particular role in system operation. FPGA 508 can be specially coupled to memory 504 through connection 510 and to I/O unit 506 through connection 512.

Processing unit 502 can direct data to an appropriate system component for processing or storage, execute a program stored in memory 504, receive and transmit data via I/O unit 506, or other similar functions. Processing unit 502 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 508 can control the logical operations of the system. As another example, FPGA 508 acts as a reconfigurable processor that can be reprogrammed as needed to handle a particular computing task. Alternatively, FPGA 508 can itself include an embedded microprocessor. Memory unit 504 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A level shifter circuit comprising:
first and second transistors, wherein the first transistor is directly coupled to the second transistor at a first node;
third and fourth transistors coupled in series, wherein the fourth transistor is coupled to the first node;
fifth and sixth transistors, wherein the fifth transistor is directly coupled to the sixth transistor at a second node; and
seventh and eighth transistors coupled in series, wherein the eighth transistor is coupled to the second node, wherein the second transistor receives a first input signal at a first control input, wherein the eighth transistor receives the first input signal at a second control input, wherein the fourth transistor receives a second input signal at a third control input, wherein the sixth transistor receives the second input signal at a fourth control input, and wherein the second input signal is inverted relative to the first input signal.

2. The level shifter circuit of claim 1 further comprising:
a ninth transistor coupled in series with the second transistor, wherein the ninth transistor receives the first input signal at a fifth control input; and
a tenth transistor coupled in series with the sixth transistor, wherein the tenth transistor receives the second input signal at a sixth control input.

3. The level shifter circuit of claim 1, wherein a terminal of each of the first and the fifth transistors is at a first supply voltage, and wherein a terminal of each of the third and the seventh transistors is at a second supply voltage that is less than the first supply voltage.

4. The level shifter circuit of claim 3 further comprising:
a ninth transistor coupled between the second transistor and a node at a ground voltage, wherein the ninth transistor receives the first input signal at a fifth control input; and
a tenth transistor coupled between the sixth transistor and a node at the ground voltage, wherein the tenth transistor receives the second input signal at a sixth control input.

5. The level shifter circuit of claim 1, wherein the fourth transistor is directly coupled to the first node, and wherein the eighth transistor is directly coupled to the second node.

6. The level shifter circuit of claim 1, wherein the level shifter circuit generates a level shifted output signal at the first node between the first and the second transistors in response to the first and the second input signals.

7. The level shifter circuit of claim 1, wherein the level shifter circuit is in a field programmable gate array integrated circuit.

8. A level shifter circuit comprising:
first and second transistors coupled in series;
third and fourth transistors coupled in series, wherein the fourth transistor is coupled to a first node between the first and the second transistors;
fifth and sixth transistors coupled in series; and
seventh and eighth transistors coupled in series, wherein the eighth transistor is coupled to a second node between the fifth and the sixth transistors, wherein the second transistor receives a first input signal at a first control input, wherein the eighth transistor receives the first input signal at a second control input, wherein the fourth transistor receives a second input signal at a third control input, wherein the sixth transistor receives the second input signal at a fourth control input, wherein the second input signal is inverted relative to the first input signal, wherein the third transistor receives the first input signal at a fifth control input, and wherein the seventh transistor receives the second input signal at a sixth control input.

9. The level shifter circuit of claim 8, wherein the first and the fifth transistors are cross-coupled, wherein a drain of the first transistor is directly coupled to a drain of the second transistor, and wherein a drain of the fifth transistor is directly coupled to a drain of the sixth transistor.

10. A level shifter circuit comprising:
first and second transistors coupled in series;
third and fourth transistors coupled in series, wherein the fourth transistor is coupled to a first node between the first and the second transistors;
fifth and sixth transistors coupled in series; and
seventh and eighth transistors coupled in series, wherein the eighth transistor is coupled to a second node between the fifth and the sixth transistors, wherein the second transistor receives a first input signal at a first control input, wherein the eighth transistor receives the first input signal at a second control input, wherein the fourth transistor receives a second input signal at a third control input, wherein the sixth transistor receives the second input signal at a fourth control input, wherein the second input signal is inverted relative to the first input signal, and wherein each of the third, the seventh, the ninth, and the tenth transistors has a thinner oxide thickness than each of the first, the second, the fourth, the fifth, the sixth, and the eighth transistors.

11. A level shifter circuit comprising:
a first transistor coupled to a node at a first supply voltage;
a second transistor coupled to the first transistor;
a third transistor coupled to a node at a second supply voltage;
a fourth transistor coupled to the third transistor, wherein the fourth transistor is directly coupled to each of the first and the second transistors;
a fifth transistor coupled to a node at the first supply voltage;
a sixth transistor coupled to the fifth transistor;
a seventh transistor coupled to a node at the second supply voltage; and
an eighth transistor coupled to the seventh transistor wherein the eighth transistor is directly coupled to each of the fifth and the sixth transistors, wherein the second transistor receives a first input signal at a first control input, wherein the eighth transistor receives the first input signal at a second control input, wherein the fourth transistor receives a second input signal at a third control input, wherein the sixth transistor receives the second input signal at a fourth control input, and wherein the second input signal is inverted relative to the first input signal.

12. The level shifter circuit of claim 11 further comprising:
a ninth transistor coupled between the second transistor and a node at a ground voltage, wherein the ninth transistor receives the first input signal at a fifth control input; and
a tenth transistor coupled between the sixth transistor and a node at the ground voltage, wherein the tenth transistor receives the second input signal at a sixth control input, and the second supply voltage is less than the first supply voltage.

13. A level shifter circuit comprising:
   a first transistor coupled to a node at a first supply voltage;
   a second transistor coupled to the first transistor;
   a third transistor coupled to a node at a second supply voltage;
   a fourth transistor coupled to the first, the second, and the third transistors;
   a fifth transistor coupled to a node at the first supply voltage;
   a sixth transistor coupled to the fifth transistor;
   a seventh transistor coupled to a node at the second supply voltage; and
   an eighth transistor coupled to the fifth, the sixth, and the seventh transistors, wherein the second transistor receives a first input signal at a first control input, wherein the eighth transistor receives the first input signal at a second control input, wherein the fourth transistor receives a second input signal at a third control input, wherein the sixth transistor receives the second input signal at a fourth control input, wherein the second input signal is inverted relative to the first input signal, wherein the third transistor receives the first input signal at a fifth control input, and wherein the seventh transistor receives the second input signal at a sixth control input.

14. The level shifter circuit of claim 13, wherein the first and the fifth transistors are cross-coupled, and wherein the level shifter circuit generates a level shifted output signal at a node between the first and the second transistors in response to the first and the second input signals.

15. The level shifter circuit of claim 14, wherein the fourth transistor is directly coupled to each of the first, the second, and the third transistors, and wherein the eighth transistor is directly coupled to each of the fifth, the sixth, and the seventh transistors.

16. A level shifter circuit comprising:
   a first transistor coupled to a node at a first supply voltage;
   a second transistor coupled to the first transistor;
   a third transistor coupled to a node at a second supply voltage;
   a fourth transistor coupled to the first, the second, and the third transistors;
   a fifth transistor coupled to a node at the first supply voltage;
   a sixth transistor coupled to the fifth transistor;
   a seventh transistor coupled to a node at the second supply voltage; and
   an eighth transistor coupled to the fifth, the sixth, and the seventh transistors, wherein the second transistor receives a first input signal at a first control input, wherein the eighth transistor receives the first input signal at a second control input, wherein the fourth transistor receives a second input signal at a third control input, wherein the sixth transistor receives the second input signal at a fourth control input, wherein the second input signal is inverted relative to the first input signal, and wherein each of the third, the seventh, the ninth, and the tenth transistors has a thinner oxide thickness than each of the first, the second, the fourth, the fifth, the sixth, and the eighth transistors.

17. A method comprising:
   pulling an output signal to a low voltage through a first current path in response to a first input signal;
   pulling a voltage at a node to a first supply voltage through a second current path in response to the first input signal and a second inverted input signal;
   pulling the voltage at the node to a second supply voltage through a third current path in response to the output signal;
   pulling the voltage at the node to the low voltage through a fourth current path in response to the second inverted input signal;
   pulling the output signal to the first supply voltage through a fifth current path in response to the first input signal and the second inverted input signal; and
   pulling the output signal to the second supply voltage through a sixth current path in response to the voltage at the node in order to level shift the output signal.

18. The method of claim 17 further comprising:
   turning off the second current path in response to the first input signal and the second inverted input signal; and
   turning off the fifth current path in response to the first input signal and the second inverted input signal.

19. The method of claim 17 further comprising:
   turning off the third current path in response to the output signal; and
   turning off the sixth current path in response to the voltage at the node.

20. The method of claim 17 further comprising:
   turning off the first current path in response to the first input signal; and
   turning off the fourth current path in response to the second inverted input signal.

* * * * *